US011978510B2

(12) United States Patent
Hsieh et al.

(10) Patent No.: US 11,978,510 B2
(45) Date of Patent: May 7, 2024

(54) MEMORY DEVICES AND METHODS OF FORMING THE SAME

(71) Applicant: GLOBALFOUNDRIES Singapore Pte. Ltd., Singapore (SG)

(72) Inventors: Curtis Chun-I Hsieh, Singapore (SG); Wei-Hui Hsu, Singapore (SG); Wanbing Yi, Singapore (SG); Yi Jiang, Singapore (SG); Kai Kang, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 274 days.

(21) Appl. No.: 17/387,964

(22) Filed: Jul. 28, 2021

(65) Prior Publication Data

US 2021/0358544 A1    Nov. 18, 2021

Related U.S. Application Data

(62) Division of application No. 16/820,651, filed on Mar. 16, 2020, now Pat. No. 11,127,459.

(51) Int. Cl.
*G11C 11/00*    (2006.01)
*G11C 13/00*    (2006.01)
(Continued)

(52) U.S. Cl.
CPC ........... *G11C 13/004* (2013.01); *H10B 63/30* (2023.02); *H10N 70/063* (2023.02);
(Continued)

(58) Field of Classification Search
CPC ..... G11C 11/10; G11C 11/15; G11C 13/0069; G11C 13/0004; G11C 13/0007; G11C 2213/79; H01L 43/08; H01L 22/228
(Continued)

(56) References Cited

U.S. PATENT DOCUMENTS 7,109,539 B2 *  9/2006  Lu .................. G11C 11/5607
                                                        365/48
8,345,467 B2    1/2013  Kim et al.
(Continued)

OTHER PUBLICATIONS

Meng-Fan Chang et al., A High-Speed 7.2-ns Read-Write Random Access 4-Mb Embedded Resistive RAM (ReRAM) Macro Using Process-Variation-Tolerant Current-Mode Read Schemes, IEEE Journal of Solid-State Circuits, Mar. 2013, 878-891, vol. 48, No. 3, IEEE, New Jersey, United States.
(Continued)

*Primary Examiner* — Son T Dinh
(74) *Attorney, Agent, or Firm* — David Cain

(57) ABSTRACT

The present disclosure generally relates to memory devices and methods of forming the same. More particularly, the present disclosure relates to resistive random-access (ReRAM) memory devices incorporating reference cells for achieving high sensing yield. The present disclosure provides a memory device including a main cell structure including a switching element arranged between a pair of conductors, and a reference cell structure electrically coupled to the main cell structure. The reference cell structure includes a switching element arranged between a pair of conductors, in which the switching element of the reference cell structure has a dimension that is different from a dimension of the switching element of the main cell structure.

17 Claims, 6 Drawing Sheets

(51) Int. Cl.
*H10B 63/00* (2023.01)
*H10N 70/00* (2023.01)

(52) U.S. Cl.
CPC ............... *G11C 2013/0045* (2013.01); *G11C 2013/0054* (2013.01); *G11C 2213/79* (2013.01)

(58) Field of Classification Search
USPC ........................................ 365/148, 158, 171
See application file for complete search history.

(56) References Cited

U.S. PATENT DOCUMENTS

| | | | |
|---|---|---|---|
| 8,510,633 B2 | 8/2013 | Sakimura et al. | |
| 8,675,388 B2 | 3/2014 | Minemura et al. | |
| 8,681,531 B2 | 3/2014 | Liu et al. | |
| 8,885,387 B2 | 11/2014 | Azuma et al. | |
| 8,902,629 B2 | 12/2014 | Kawai et al. | |
| 8,982,603 B2 | 3/2015 | Azuma et al. | |
| 9,257,648 B2 | 2/2016 | Liu et al. | |
| 9,424,920 B2 | 8/2016 | Liu et al. | |
| 10,418,100 B2 | 9/2019 | Han | |
| 10,586,581 B1* | 3/2020 | Patel | G11C 13/0026 |
| 2006/0007725 A1 | 1/2006 | Ozeki | |
| 2009/0067257 A1 | 3/2009 | Lee et al. | |
| 2009/0161422 A1* | 6/2009 | Zhu | G11C 11/1673 365/171 |
| 2010/0018588 A1* | 1/2010 | Lee | E03C 1/0408 4/612 |
| 2018/0068702 A1* | 3/2018 | Jung | G11C 11/1673 |

OTHER PUBLICATIONS

Kuan-Liang Lin et al., Electrode dependence of filament formation in HfO2 resistive-switching memory, Journal of Applied Physics 109, 2011, 1-7, American Institute of Physics, Maryland, United States.

W.C. Chien et al., High-Speed Multilevel Resistive RAM Using RTO WOX, International Conference on Solid State Devices and Materials, Sendai, 2009, 1206-1207.

* cited by examiner

MEMORY DEVICES AND METHODS OF FORMING THE SAME

CROSS REFERENCE TO RELATED APPLICATION

The present application is a divisional application of U.S. patent application Ser. No. 16/820,651 filed on Mar. 16, 2020, the disclosure of which is expressly incorporated by reference herein in their entirety.

FIELD OF THE INVENTION

The disclosed subject matter relates generally to memory devices and methods of forming the same. More particularly, the present disclosure relates to resistive random-access (ReRAM) memory devices incorporating reference cells for achieving high sensing yield.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used electronic products due to its ability to retain data for long periods of time.

NV memory devices may be categorized based on their read/write mechanism. Exemplary categories for NV memory may include resistive random-access memory (ReRAM), erasable programmable read-only memory (EPROM), flash memory, ferroelectric random-access memory (FeRAM), and magnetoresistive random-access memory (MRAM). NV memory devices may be built with device components such as transistors (e.g., fin-shaped field-effect transistors (FinFETs), ferroelectric field-effect transistors (FeFETs), complementary metal-oxide semiconductor (CMOS) transistors), and capacitors (e.g., metal-insulator-metal (MIM) capacitors).

Current-mode sensing amplifiers (CSAs) are commonly used in memory devices, which monitor "read currents" of the memory cells using reference cells to generate "reference current" for the CSAs. The reference current generated is being compared with the read current. However, it was found that resistance change NV memory devices, such as the ReRAM, have large variations in resistance. This may cause an unstable reference current (i.e., large fluctuations in the reference current) which results in a low sensing margin of the CSAs.

One possible approach of stabilizing the reference current is to program the memory device using an averaging bits technique, which may involve steps of oversampling and averaging the data output from multiple memory cells. The use of the averaging bits technique typically requires multiple memory arrays, each array comprising multiple reference cells and memory cells. However, by using multiple reference cells and memory cells, it was found that the resulting memory device became larger in size and incurred a higher manufacturing cost.

With the semiconductor industry's drive for higher density, higher performance, lower-cost devices and the implementation of nanometer-scale process nodes, there is a need to provide memory devices that can overcome, or at least ameliorate, one or more of the disadvantages as described above.

SUMMARY

In an aspect of the present disclosure, there is provided a memory device including a main cell structure having a dimension, and a reference cell structure electrically coupled to the main cell structure. The reference cell structure has a dimension that is different from the dimension of the main cell structure, in which the main cell structure and the reference cell structure include a switching element arranged between a pair of conductors.

In another aspect of the present disclosure, there is provided a memory device including a main cell structure including a switching element arranged between a pair of conductors, and a reference cell structure electrically coupled to the main cell structure. The reference cell structure includes a switching element arranged between a pair of conductors, in which the switching element of the reference cell structure has a dimension that is different from a dimension of the switching element of the main cell structure.

In yet another aspect of the present disclosure, there is provided a method of forming a memory device by forming a first conductor layer above a substrate, forming a switching element on the first conductor layer, forming a second conductor layer above the switching element, and patterning the first conductor layer, the switching element, and the second conductor layer to form a main cell structure and a reference cell structure being electrically coupled to the main cell structure, where the reference cell structure is formed with a dimension that is different from a dimension of the main cell structure.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
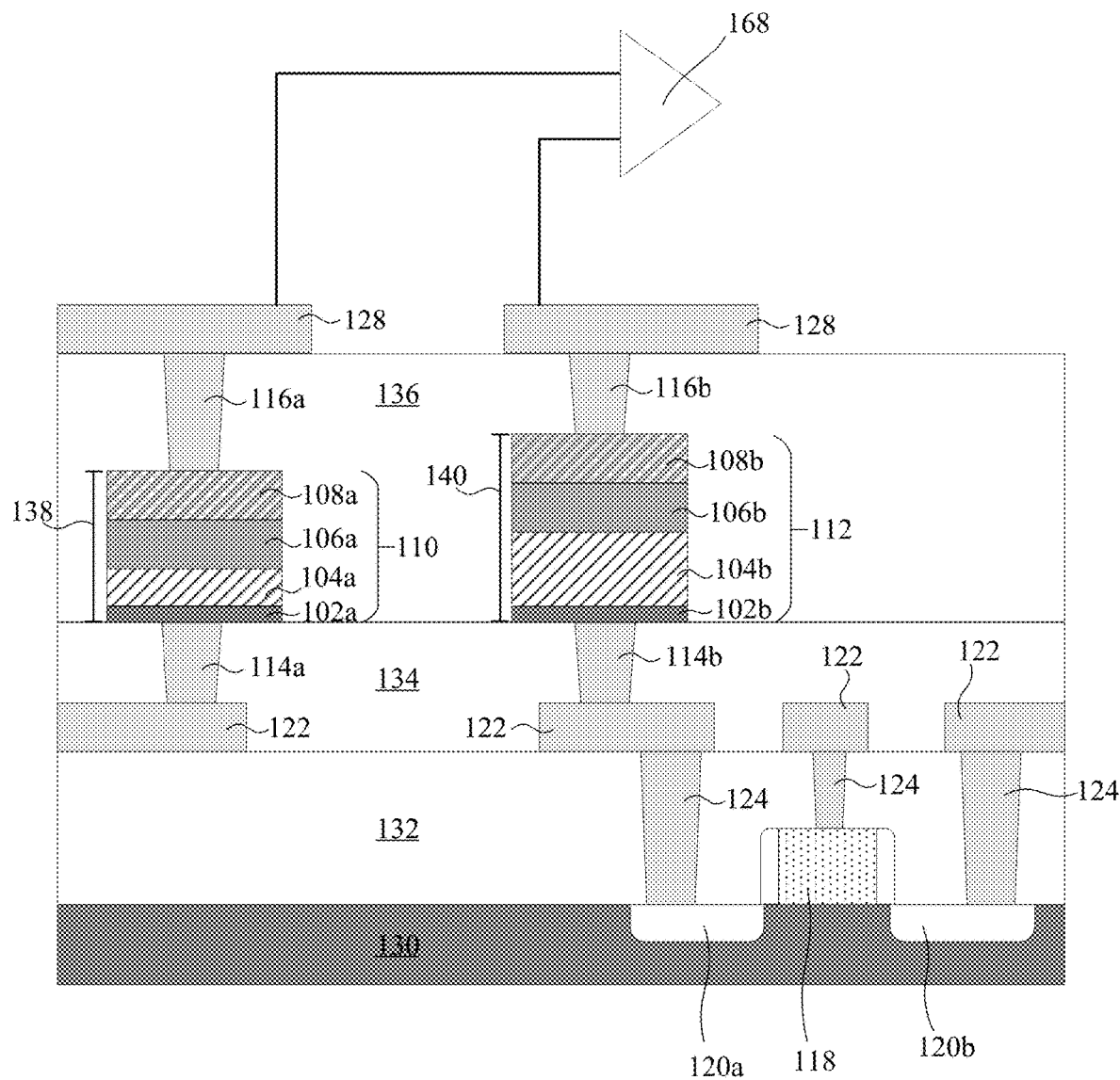
FIG. 1 is a cross-sectional view of an embodiment of a memory device, in accordance with the present disclosure.

Referring to FIG. 1, a cross-sectional view of an exemplary memory device is shown. The device includes a main cell structure 112 and a reference cell structure 110. The main cell structure 112 may function as memory cells that enable read/write/erase capabilities of a memory device during its operation. The main cell structure 112 may be configured to generate a read current. The reference cell structure 110 may function to provide tracking of the changes in resistance of the main cell structures during the device operation. The reference cell structure 110 may be configured to generate a reference current for comparison with the generated read current from the main cell structure 112.

The reference cell structure 110 may include a switching element 104a arranged between a pair of conductors 102a and 106a in a vertically stacked configuration. Similarly, the main cell structure 112 may include a switching element 104b arranged between a pair of conductors 102b and 106b in a vertically stacked configuration. For example, as shown in FIG. 1, the switching element 104a, 104b may be arranged between a bottom conductor 104a, 104b and a top conductor 106a, 106b. Additionally, a capping layer 108a, 108b may be disposed upon the top conductor 106a, 106b.

As shown in FIG. 1, the main cell structure 112 and the reference cell structure 110 are electrically connected to a sensing amplifier 168. The sensing amplifier 168 may be configured to compare the read current generated from the main cell structure 112 with the reference current generated from the reference cell structure 110. The main cell structure 112 is therefore electrically coupled to the reference cell structure 110 by the sensing amplifier 168.

Figure 2:
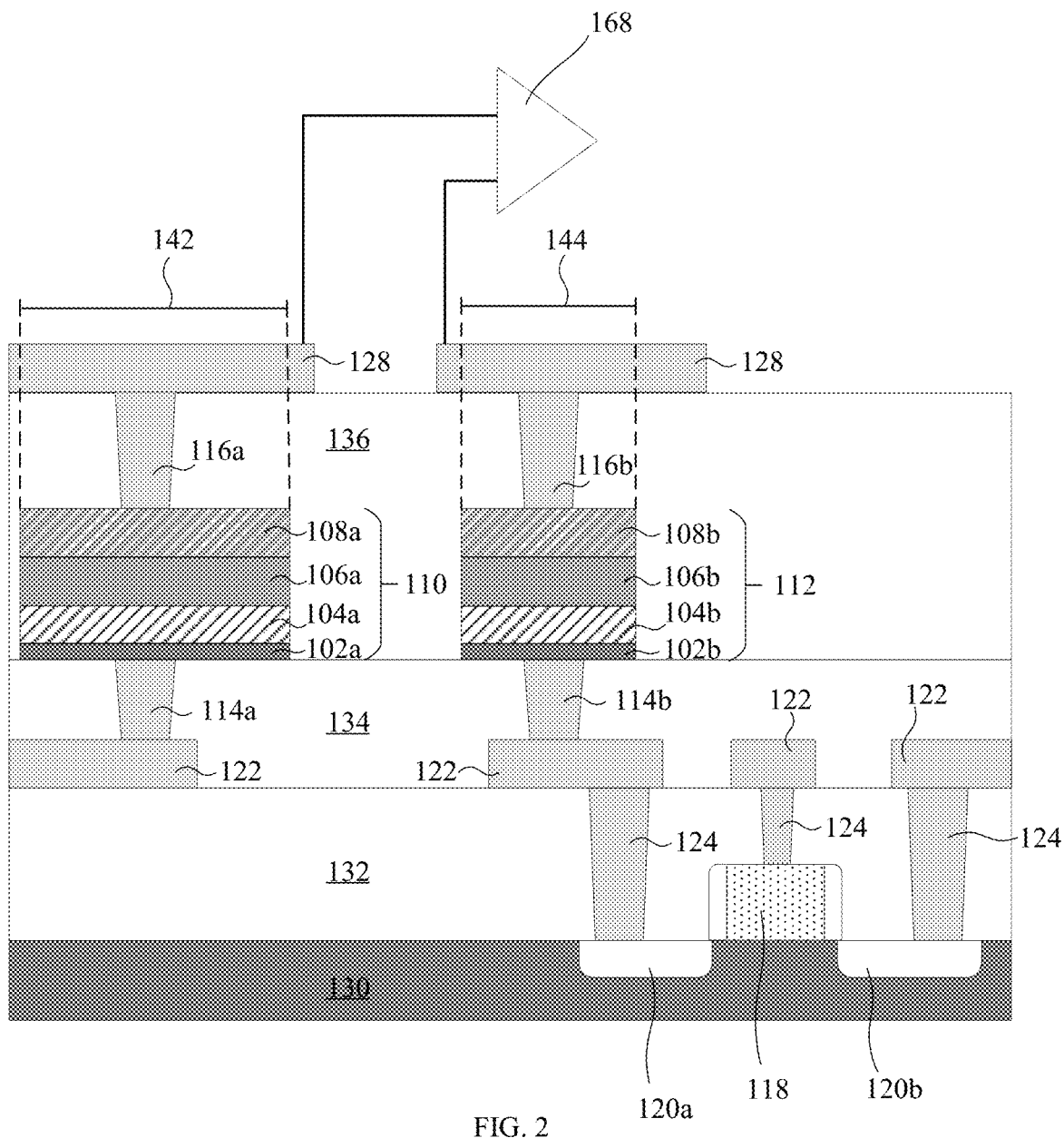
FIG. 2 is a cross-sectional view of another embodiment of a memory device, in accordance with the present disclosure.

The reference cell structure 110 has a dimension that is different from a dimension of the main cell structure 112. The dimensions of the reference cell structure 110 and the main cell structure 112 may be a thickness dimension 138, 140 or a width dimension 142, 144. The thickness dimension 138, 140 is taken as the distance between a top surface and a bottom surface of a cell structure, as shown in FIG. 1. The width dimension 142, 144 is taken as the distance between sidewalls of a cell structure, as shown in FIG. 2. As will be described below, depending on the type of dimension, the reference cell structure 110 may have either a larger dimension or a smaller dimension than the main cell structure 112.

In the embodiment shown in FIG. 1, the thickness dimension 138 of the reference cell structure 110 is smaller than the thickness dimension 140 of the main cell structure 112. In some embodiments, the switching element 104a of the reference cell structure 110 has a smaller thickness than the switching element 104b of the main cell structure 112. The thickness dimension of the switching element 104a of the reference cell structure 110 may be smaller than the thickness dimension of the switching element 104b of the main cell structure 112 by a factor of 1.5 to 2. The smaller thickness of the switching element 104a in the reference cell structure 110 may reduce the electrical resistance between the bottom conductor 102a and the top conductor 106a. Accordingly, the intrinsic resistance property of the reference cell structure 110 can be reduced relative to the main cell structure 112, which enlarges or widens the sensing margin of the sensing amplifier 168 in the memory device.

Referring to FIG. 2, a cross-sectional view of another exemplary memory device is shown. In FIG. 2, the width dimension 142 of the reference cell structure 110 is larger than the width dimension 144 of the main cell structure 112. The width dimension 142 of the reference cell structure 110 may be larger than the width dimension 144 of the main cell structure 112 by a factor in a range of 1.5 to 5. In some embodiments, the switching element 104a of the reference cell structure 110 has a larger width than the switching element 104b of the main cell structure 112.

By having a larger width dimension, the surface area contact between the components in the reference cell structure 110 (e.g., bottom conductor, top conductor, switching element) can be increased, thereby reducing the intrinsic electrical resistance property of the reference cell structure 110 relative to the main cell structure 112. Accordingly, the reduction in the electrical resistance is found to stabilize the reference cell, which enlarges or widens the sensing margin of the sensing amplifier 168 in the memory device.

Referring to FIG. 1 and FIG. 2, the main cell structure 112 and the reference cell structure 110 may be connected to various active components in the memory device by interconnect structures. The interconnect structures may provide routing of electrical signals to and from the main cell structure 112 and the reference cell structure 110. The interconnect structures may be made of a metallic material such as copper, cobalt, aluminum or an alloy thereof. The interconnect structures shown in the accompanying drawings includes vias 114a, 114b, 116a, 116b, 124 and conductive lines 122, 128. In some embodiments, the conductive lines 122, 128 may function as bit lines Example of active components may include diodes (e.g., single-photon avalanche diode) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT). Although the accompanying drawings illustrate the integration of the main cell structure 112 and the reference cell structure 110 with a planar field-effect transistor, it should be understood that other active components are also contemplated within the scope of the present disclosure.

As shown in FIG. 1 and FIG. 2, the main cell structure 112 may be connected to a planar field-effect transistor. The planar field-effect transistor may include a gate 118 and source or drain regions 120a, 120b. The source or drain regions 120a, 120b are located in a substrate 130 with the gate 118 disposed upon the substrate 130. One of the source or drain region 120a is connected to the main cell structure 112 by interconnect structures.

The gate 118 and the vias 124 connecting the source or drain regions 120a, 120b may be embedded in a first inter-metal dielectric (IMD) layer 132 disposed upon the substrate 130. A second IMD layer 134 may be disposed upon the first IMD layer 132. The bottom conductor 102a of the reference cell structure 110 and the bottom conductor 102b of the main cell structure 112 may be disposed on bottom vias 114a, 114b. The bottom vias 114a, 114b are embedded within the second IMD layer 134.

Top vias 116a, 116b may be disposed on the capping layer 108a of the reference cell structure 110 and the capping layer 108b of the main cell structure 112. The reference cell structure 110, the main cell structure 112 and the top vias 116a, 116b may be embedded in a third 1 MB layer 136 disposed upon the second 1 MB layer 134. Additionally, conductive lines 128 are disposed upon the third IMD layer 136 and connected to the top vias 116a, 116b.

Figure 3:
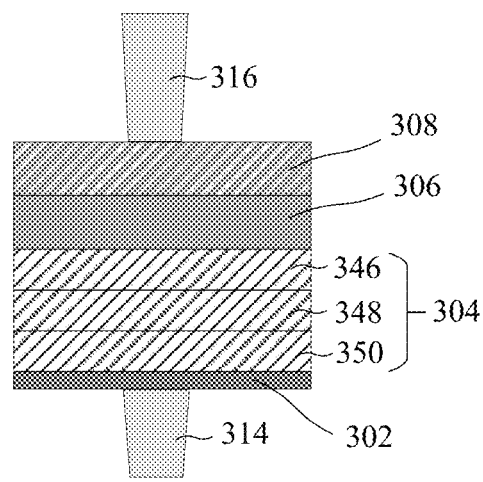
FIG. 3 is an enlarged cross-sectional view depicting components of an exemplary cell structure for the memory device, in accordance with embodiments of the present disclosure.

FIG. 3 illustrates an enlarged view of the components in an exemplary cell structure for both the main cell structure 112 and the reference cell structure 110 described herein.

As shown, the bottom conductor 302 is disposed on the bottom via 314. The switching element 304 may include at least one dielectric layer. For example, the switching element 304 has three dielectric layers 346, 348, 350. Alternatively, the switching element is a single dielectric layer, as shown in FIG. 1 and FIG. 2. The dielectric material for the switching element 304 may include carbon polymers, perovskites, metal oxides and nitrides. Some examples of metal oxides include lanthanide oxides, tungsten oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides include boron nitride and aluminum nitride. In some embodiments, metal oxides with a bandgap greater than 3 eV may be used. Examples of such oxides include titanium oxide, tungsten oxide, niobium oxide, nickel oxide, zinc oxide, lanthanide oxides, hafnium oxide, aluminum oxide, tantalum oxide, zirconium oxide, and yttrium oxide.

The top conductor 306 is disposed on the switching element 304. The bottom conductor 302 and the top conductor 306 includes a conductive material such as, but not limited to, titanium, titanium nitride, tantalum, tantalum nitride, and platinum.

The switching element 304 is configured to have a switchable resistance in response to a change in voltage between the pair of conductors, e.g., the bottom conductor 302 and the top conductor 306. Ideally, the switching element 304 may exhibit resistive changing properties characterized by different resistive states of the material forming this layer. These resistive states (e.g., a high resistive state or a low resistive state) may be used to represent one or more bits of information. During operational switching used to change the stored data, the switching element changes its resistive state when a certain switching voltage (e.g., a set voltage or a reset voltage) is applied to the switching element and generates a switching current through the switching element.

The capping layer 308 may serve as a protective layer for the top conductor 106. The capping layer 308 is disposed on the top conductor 106 and may include a metallic compound capable of conducting electricity. Some examples of metallic compounds for the capping layer 308 may include, but not limited to, titanium, aluminum, tantalum, a stack thereof, a conductive oxide thereof, a conductive nitride thereof, an alloy thereof, and a combination thereof. The top via 316 is disposed on the capping layer 308.

Advantageously, the memory devices of the present disclosure may stabilize the reference cell of the memory device and therefore enlarges its sensing margin and providing higher sensing yield. Additionally, the memory device of the present disclosure does not require multiple reference cells and memory cells to achieve an enlarged sensing margin and therefore having smaller sizes as compared to conventional memory devices. More advantageously, the present disclosure may provide a reduced intrinsic resistance of the reference cell structure as compared to the intrinsic resistance of the main cell structure, which may enable the stabilization of the reference cell during device operation.

Figure 4:
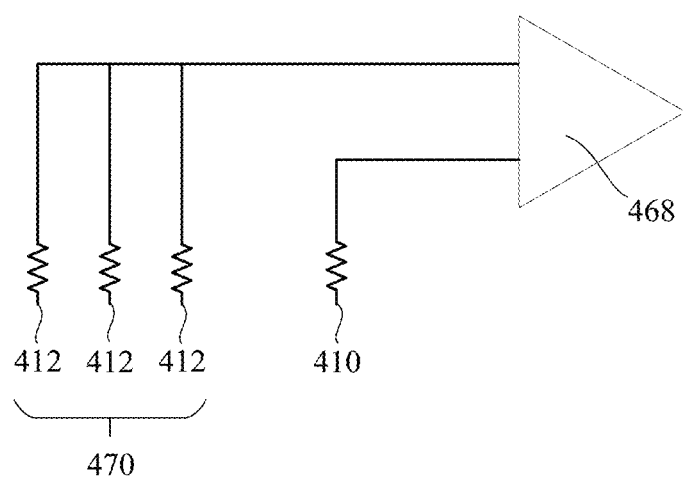
FIG. 4 is a simplified circuit diagram depicting the electrical coupling of multiple main cells and a reference cell to a sensing amplifier, in accordance with embodiments of the present disclosure.

Referring to FIG. 4, the memory device of the present disclosure may further include a main array 470 having a plurality of the main cell structures 412, each of the main cell structure 412 being electrically coupled to the reference cell structure 410 by the sensing amplifier 468. Advantageously, a single reference cell structure may be sufficient to provide stability to a plurality of main cell structures during device operation, and thereby enlarging the sensing margin of the sensing amplifier. Additionally, the resulting memory device may be smaller in size and this may also reduce the manufacturing cost.

FIGS. 5 through 10 show a set of steps that may be used to create the memory devices as provided for in embodiments of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

Figure 5:
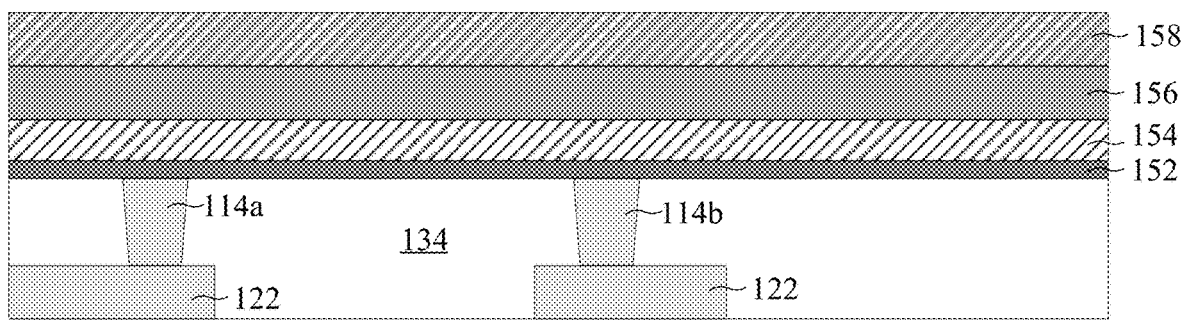
FIGS. 5 to 10 are cross-sectional views depicting various stages of forming a memory device, in accordance with embodiments of the present disclosure.

FIG. 5 illustrates the formation of a first conductor layer 152, a first switching element layer 154, a second conductor layer 156, and a first capping layer 158 above an inter-metal dielectric (IMD) layer 134. The IMD layer 134 may be embedded with interconnect structures that are connected to other active components of the memory device. The formation of the first conductor layer 152, the first switching element layer 154, the second conductor layer 156, and the first capping layer 158 may include several deposition steps using deposition techniques described herein. In particular, the IMD layer 134 may include bottom vias 114a, 114b upon which the first conductor layer 152 is deposited. The first switching element layer 154 may be formed by depositing a dielectric layer described herein.

Figure 6:
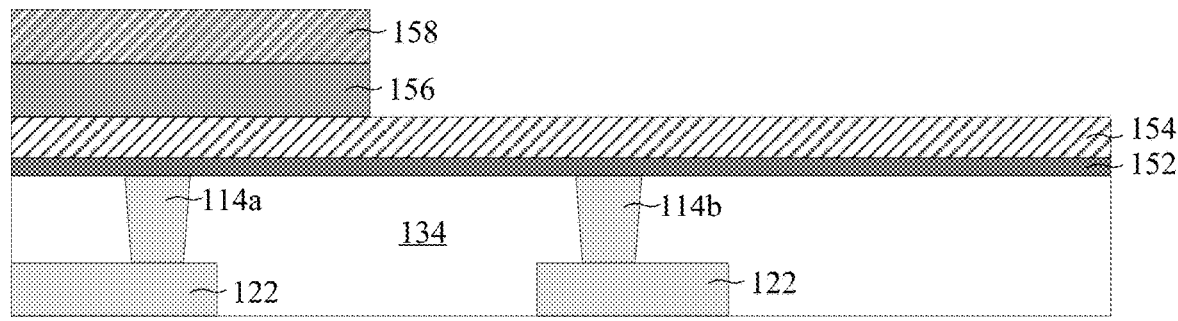

FIG. 6 illustrates the patterning of the first capping layer 158 and the second conductor layer 156 to expose a portion of the underlying first switching element layer 154. The patterning of the first capping layer 158 and the second conductor layer 156 may include several patterning steps using the patterning techniques described herein. As shown, the patterning steps also remove portions of the first capping layer 158 and the second conductor layer 156.

Figure 7:
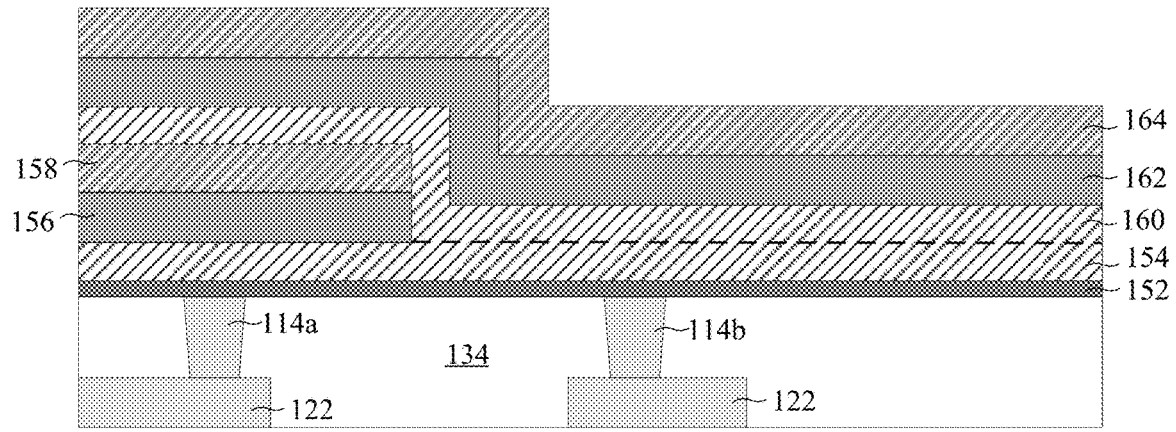

FIG. 7 illustrates the formation of a second switching element layer 160, a third conductor layer 162, and a second capping layer 164 above the structure shown in FIG. 6. Various deposition techniques may be used to forms the layers shown in FIG. 7, however, it may be preferable to employ a conformal deposition such as ALD or a highly-conformal CVD process. The second switching element layer 160 may be deposited upon the first capping layer 158 and the exposed first switching element layer 154. Subsequently, the third conductor layer 162 may be deposited on the second switching element layer 160, followed by the second capping layer 164 on the third conductor layer 162. The second switching element layer 160 may be formed by depositing a dielectric layer described herein. The second switching element layer 160 and the first switching element layer 154 may be of the same dielectric material. Alternatively, the second switching element layer 160 has a dielectric material different from that of the first switching element layer 154.

Figure 8:
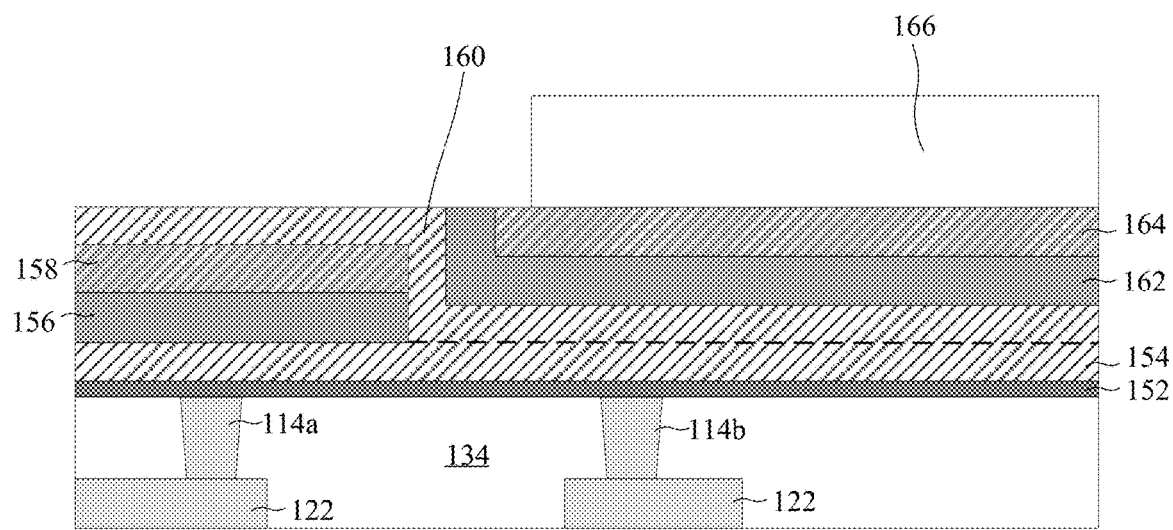

FIG. 8 illustrates the patterning of the third conductor layer 162 and the second capping layer 164 to expose a portion of the second switching element layer 160 overlying the first capping layer 158. The patterning step illustrated in FIG. 8 may be performed using the patterning techniques described herein. For example, a photoresist layer 166 may be used to cover a portion of the second capping layer 164 and subsequently, etching processes remove the uncovered portions of the third conductor layer 162 and the second capping layer 164.

Figure 9:
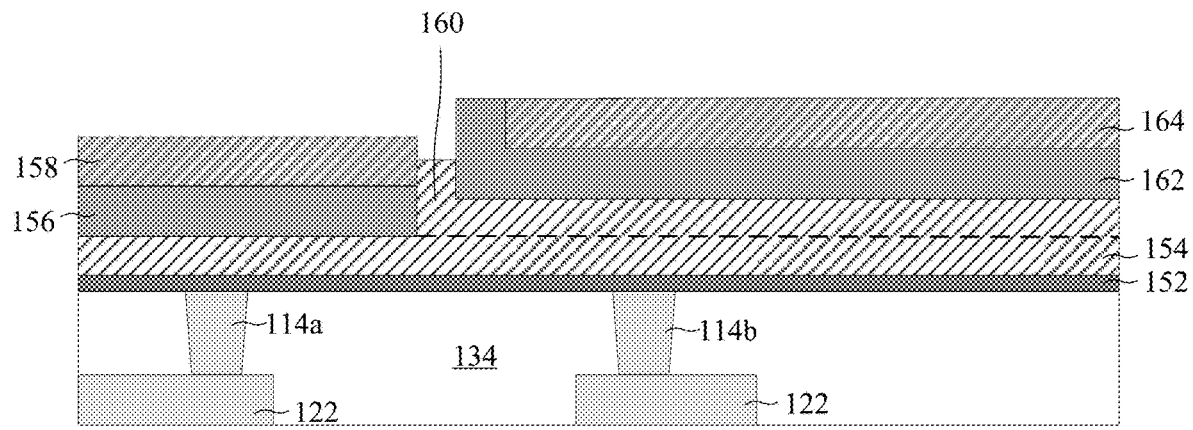

FIG. 9 illustrates the removal of the exposed portion of the second switching element layer in the structure shown in FIG. 8. The removal of the exposed portion may be performed using an etching process and consequently, exposes the underlying first capping layer 158.

Figure 10:
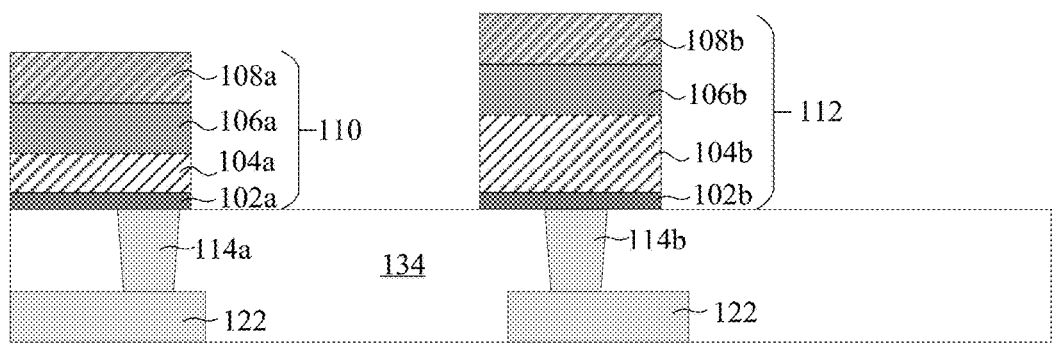

FIG. 10 illustrates the patterning of the structure shown in FIG. 9 to form the main cell structure 112 and the reference cell structure 110 described herein. The patterning may include several patterning steps using the patterning techniques described herein. As shown in the embodiment of FIG. 10, the first conductor layer 152 is patterned to form the bottom conductors 102a, 102b of the corresponding reference cell structure 110 and the main cell structure 112. The first switching element layer 154 and the second switching element layer 160 are patterned such that the switching element 104a of the reference cell structure 110 is formed from the first switching element layer 154 only, whereas the switching element 104b of the main cell structure 112 is formed from both the first switching element layer 154 and the second switching element layer 160.

The second conductor layer 156 is patterned to form the top conductor 106a of the reference cell structure 110, whereas the third conductor layer 162 is patterned to form the top conductor 106b of the main cell structure 112. Additionally, the first capping layer 158 is patterned to form the capping layer 108a of the reference cell structure 110, whereas the second capping layer 164 is patterned to form the capping layer 108b of the main cell structure 112. In the embodiment shown in FIG. 10, the resulting reference cell structure 110 has a smaller thickness than that of the main cell structure 112.

The structure shown in FIG. 5 may be alternatively patterned to form the embodiment shown in FIG. 2. For simplicity, processing stages continuing from the structure shown in FIG. 5 are not shown, however, it should be understood that these subsequent processing stages are also within the scope of the present disclosure. To form the embodiment shown in FIG. 2, the structure shown in FIG. 5 may be patterned using patterning techniques to form the reference cell structure with a larger width dimension than the main cell structure. Reticle masks may be used during the patterning step to vary the respective widths for the main cell structure and the reference cell structure.

Throughout this disclosure, the terms top, upper, upwards, over, and above refer to the direction away from the IMD layer 134 or the substrate 130. Likewise, the terms bottom, lower, downwards, under, and below refer to the direction towards the 1 MB layer 134 or the substrate 130. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory device comprising:
   a main cell structure including a switching element arranged between a pair of conductors, the switching element is structured as a single dielectric layer; and
   a reference cell structure electrically coupled to the main cell structure, the reference cell structure including a switching element arranged between a pair of conductors, the switching element is structured as a single dielectric layer, wherein the switching element of the reference cell structure has a dimension that is different from a dimension of the switching element of the main cell structure.

2. The device of claim 1, wherein the switching element of the reference cell structure has a smaller thickness dimension than the switching element of the main cell structure.

3. The device of claim 2, wherein the thickness dimension of the switching element of the reference cell structure is smaller than the thickness dimension of the switching element of the main cell structure by a factor of 1.5 to 2.

4. The device of claim 2, wherein the reference cell structure has a reduced intrinsic resistance relative to the main cell structure.

5. The device of claim 1, wherein the switching element of the reference cell structure has a larger width dimension than the switching element of the main cell structure.

6. The device of claim 1, wherein the switching element is configured to have a switchable resistance in response to a change in voltage between the pair of conductors.

7. The device of claim 1, further comprising a main array having a plurality of the main cell structures, each of the main cell structure being electrically coupled to the reference cell structure.

8. The device of claim 1, wherein the switching element is arranged between a bottom conductor and a top conductor, and further comprising a capping layer disposed on the top conductor.

9. The device of claim 1, wherein the main cell structure is electrically coupled to the reference cell structure by a sensing amplifier.

10. The device of claim 9, wherein the main cell structure is configured to generate a read current and the reference cell structure is configured to generate a reference current for comparison with the generated read current.

11. The device of claim 10, wherein the sensing amplifier is configured to compare the read current generated from the main cell structure with the reference current generated from the reference cell structure.

12. The device of claim 11, wherein the main cell structure is connected to a planar field-effect transistor.

13. A memory device comprising:
a main cell structure including a switching element arranged between a pair of conductors, the switching element includes a first switching element layer and a second switching element layer, wherein the second switching element layer has a dielectric material different from that of the first switching element layer; and
a reference cell structure electrically coupled to the main cell structure, the reference cell structure including a switching element arranged between a pair of conductors, the switching element includes a third switching element layer, wherein the third switching element layer has the same dielectric material as the first switching element layer, wherein the switching element of the reference cell structure has a dimension that is different from a dimension of the switching element of the main cell structure.

14. The device of claim 13, wherein the switching element of the reference cell structure has a smaller thickness dimension than the switching element of the main cell structure.

15. The device of claim 14, wherein the thickness dimension of the switching element of the reference cell structure is smaller than the thickness dimension of the switching element of the main cell structure by a factor of 1.5 to 2.

16. The device of claim 13, wherein the switching element of the reference cell structure has a larger width dimension than the switching element of the main cell structure.

17. The device of claim 1, wherein the switching element of the main cell structure has the same dielectric material as the switching element of the reference cell structure.

* * * * *